United States Patent
Machiyama et al.

(10) Patent No.: US 8,036,839 B2
(45) Date of Patent: Oct. 11, 2011

(54) BATTERY STATE DETERMINING APPARATUS

(75) Inventors: Yoshiaki Machiyama, Fukaya (JP); Keizo Yamada, Honjyo (JP); Yoshifumi Yamada, Fukaya (JP); Takashi Hara, Honjyo (JP)

(73) Assignee: Shin-Kobe Electric Machinery Co., Ltd., Tokyo (JP)

( * ) Notice: Subject to any disclaimer, the term of this patent is extended or adjusted under 35 U.S.C. 154(b) by 505 days.

(21) Appl. No.: 12/282,347

(22) PCT Filed: Mar. 8, 2007

(86) PCT No.: PCT/JP2007/054553
§ 371 (c)(1),
(2), (4) Date: Sep. 9, 2008

(87) PCT Pub. No.: WO2007/105595
PCT Pub. Date: Sep. 20, 2007

(65) Prior Publication Data
US 2009/0088994 A1    Apr. 2, 2009

(30) Foreign Application Priority Data

Mar. 10, 2006  (JP) ................................. 2006-065280
Apr. 7, 2006   (JP) ................................. 2006-105793
Apr. 7, 2006   (JP) ................................. 2006-105803

(51) Int. Cl.
*G01R 31/36*   (2006.01)
*H02J 7/00*    (2006.01)
*G08B 21/00*   (2006.01)

(52) U.S. Cl. ..................... 702/63; 320/136; 340/636.19

(58) Field of Classification Search .................... 702/63, 702/57, 60, 64–67, 81, 84, 127, 130–131, 702/179, 182–184, 189; 320/124, 127, 134–136, 320/149, 155, 166; 324/425–434; 340/636.1, 340/636.11–636.13, 636.15–636.16, 636.18–636.19
See application file for complete search history.

(56) References Cited

U.S. PATENT DOCUMENTS
2002/0113593 A1    8/2002  Meissner et al.

FOREIGN PATENT DOCUMENTS
EP    0 916 959 A2    5/1999
JP    7-63114 A       3/1995
(Continued)

OTHER PUBLICATIONS

English Translation of JP 2004025982—Shin Kobe Elecrtric Machinery, Method of Estimating Remaining Capacity of Battery, Jan. 29, 2004, 18 pp.*
European Search Report dated Apr. 6, 2010 from corresponding European Patent Application No. EP 07 73 8043.
(Continued)

Primary Examiner — Michael Nghiem
Assistant Examiner — Toan Le
(74) Attorney, Agent, or Firm — Roberts Mlotkowski Safran & Cole, P.C.

(57) ABSTRACT

A battery state determining apparatus is provided which can accurately determine a state of a lead battery in an automotive vehicle. The apparatus calculates a corrected engine starting voltage $Vst1$ from an open-circuit voltage (OCV) measuring section that measures the open circuit voltage $Vst$ of the lead battery at an engine starting time in accordance with a temperature of the vehicle. The apparatus further calculates a battery determination voltage $Vst\_th$ representing a voltage of the lead battery at an engine starting time when a growth rate of internal resistance of the lead battery reaches a predetermined value from the open-circuit voltage OCV. The apparatus then determines the battery state of the lead battery by determining whether the corrected engine starting voltage $Vst1$ is larger than the battery determination voltage $Vst\_th$ and whether the corrected engine starting voltage $Vst1$ belongs to a predetermined region on a characteristic map.

21 Claims, 5 Drawing Sheets

FOREIGN PATENT DOCUMENTS

| | | |
|---|---|---|
| JP | 7-63830 A | 3/1995 |
| JP | 2001-163129 A | 6/2001 |
| JP | 2004-25982 A | 1/2004 |
| JP | 2004-42799 A | 2/2004 |
| JP | 2005-146939 A | 6/2005 |
| JP | 2005-292035 A | 10/2005 |
| JP | 2006-15896 A | 1/2006 |

OTHER PUBLICATIONS

International Search Report of PCT/JP2007/054553 mailed May 15, 2007.

Japanese Search Report dated Oct. 12, 2010 from corresponding Japanese Patent Application No. 2006-065280 (English translation attached).

* cited by examiner

BATTERY STATE DETERMINING APPARATUS

FIELD OF THE INVENTION

The present invention relates to a battery state determining apparatus, and in particular to a battery state determining apparatus which determines a battery state of a lead battery mounted on a vehicle.

DESCRIPTION OF THE RELATED ART

A starting lead battery for an internal combustion engine (hereinafter called "lead battery") is a considerably important part for a gasoline engine vehicle, a diesel engine vehicle or the like (hereinafter called "vehicle") equipped with an internal combustion engine system in order to secure reliable starting of such an engine.

A lead battery (a lead battery for an automobile) mounted on a vehicle supplies power to not only a vehicle itself but also various electric devices mounted on the vehicle. The vehicle is equipped with an electric generator (alternator) driven by an engine, and a lead battery is charged according to operation control of the alternator and a capacity thereof is maintained. In recent years, for example, in view of increase of electric load on a vehicle such as a car navigation system and/or environmental care, a hybrid electric automobile equipped with a combination of an electric motor and an engine, an automobile configured such that an engine is stopped at a stoplight or the like and the engine is re-started at a startup or the like (equipped with an ISS system), and the like have been developed.

A technique for detecting a degraded state of a lead battery accurately becomes important under such a use environment of a lead battery in order to detect a degraded state of the lead battery accurately and grasp a present state of charge thereof to always prevent obstruction to vehicle running (for example, because there is such a possibility that, when a remaining capacity of a lead battery is reduced due to load of various electric devices during stopping of an engine, output sufficient to start the engine cannot be obtained so that the engine after engine stopping cannot be re-started).

Trials have been heretofore conducted for detecting SOC or SOH of a lead battery by various techniques such as open-circuit voltage measurement of a lead battery, internal resistance measurement using AC current, measurement of charge voltage, discharge voltage, charge current, or discharge current. For example, a battery remaining capacity detecting technique for a hybrid car which measures voltage or voltage drop of a lead battery when a starter motor is started up and monitors whether or not the voltage or the voltage drop exceeds a threshold value to detect the state of the lead battery or compares voltage or AC internal resistance at an engine startup time and a data map measured in advance with each other to calculate a battery state, and the like have been proposed. (See Patent Literatures 1 to 3.)

As a battery testing method using a vehicle, a method for evaluating a voltage in a state that a starter motor is being rotated has been known. The method is used from long ago as a lead battery checking method for examining whether a cause of an engine startup inability is the starter or a lead battery regarding a vehicle whose engine startup is disabled. In the method, measurement using a simple voltmeter whose time responsibility is poor is generally performed without using an oscilloscope, for example, where a normal state is determined if a voltage is about 9V or higher in a state that a voltage is relatively stable after inrush current. When a vehicle is put in such a condition that, by taking measures for preventing supplying fuel to an engine or the like, the engine is not started actually, even if a starter motor is rotated, a temporally stable voltage can be obtained even in a normal vehicle so that a lead battery can be checked.

[Patent Literature 1] JP-A-07-63114
[Patent Literature 2] JP-A-07-63830
[Patent Literature 3] JP-A-2001-163129

In many cases, however, a ground for SOH determination is not shown explicitly in the conventional SOC or SOH detecting technique for a lead battery. That is, in many cases, a ground for determining that SOH has been lowered in a certain state of the lead battery is poor. This is because knowledge about characteristic of a lead battery is insufficient since it is generally a much troublesome task to collect data about characteristic at each SOH of the lead battery. The characteristic of the lead battery varies according to SOC, a temperature, or the like even if SOH is constant, where, especially, when an engine starting-up voltage at an engine start-up time is utilized for battery state detection, temperature characteristic of an electric resistance on a vehicle side largely influences the characteristic of the lead battery, which may result in erroneous determination.

SUMMARY OF THE INVENTION

In view of these circumstances, the present invention has been made, and an object thereof is to provide a battery state determining (judging) apparatus which can determine a degraded (deteriorated) state of a lead battery accurately using a characteristic map defining a relationship among SOH, an open-circuit voltage, and the minimum (lowest) voltage of a lead battery.

In order to solve the above problem, according to a first aspect of the present invention, there is provided a battery state determining apparatus for determining a battery state of a lead battery mounted on a vehicle, comprising: an open-circuit voltage measuring section which measures an open-circuit voltage OCV of the lead battery; an engine starting voltage measuring section which measures an engine starting voltage Vst representing a voltage at an engine starting time of the lead battery; a vehicle temperature measuring section which measures a temperature of the vehicle; an engine starting voltage correcting section which calculates an engine starting voltage Vst1 obtained by correcting the engine starting voltage Vst measured at the engine starting voltage measuring section based upon the open-circuit voltage OCV measured at the open-circuit voltage measuring section and the temperature of the vehicle measured at the vehicle temperature measuring section; a determination voltage arithmetic section which calculates, from the open-circuit voltage OCV measured at the open-circuit voltage measuring section, a lead battery determination voltage Vst_th representing a voltage at an engine starting time of the lead battery when an increase rate of internal resistance of the lead battery reaches a predetermined value for lead battery replacement; and a battery state determining section which determines whether or not the engine starting voltage Vst1 calculated at the engine starting voltage correcting section is equal to or more than the lead battery determination voltage Vst_th calculated at the determination voltage arithmetic section.

In order to solve the above problem, according to a second aspect of the present invention, there is provided a battery state determining apparatus for determining a battery state of a lead battery mounted on a vehicle, comprising: an open-circuit voltage measuring section which measures open-circuit voltage OCV of the lead battery; an engine starting voltage measuring section which measures an engine starting voltage Vst representing a voltage at an engine starting time of the lead battery; a lead battery temperature measuring section which measures a temperature of the lead battery; an engine starting voltage correcting section which calculates an engine starting voltage Vst1 obtained by correcting the engine starting voltage Vst measured at the engine starting voltage measuring section based upon the open-circuit voltage OCV measured at the open-circuit voltage measuring section and a temperature of the vehicle; a determination voltage arithmetic section which calculates, from the open-circuit voltage OCV measured at the open-circuit voltage measuring section, a lead battery determination voltage Vst_th representing a voltage at an engine starting time of the lead battery when an increase rate of internal resistance of the lead battery reaches a predetermined value for lead battery replacement; and a battery state determining section which determines whether or not the engine starting voltage Vst1 calculated at the engine starting voltage correcting section is equal to or more than the lead battery determination voltage Vst_th calculated at the determination voltage arithmetic section, wherein the engine starting voltage correcting section calculates the engine starting voltage Vst1 while regarding the temperature of the lead battery measured at the lead battery temperature measuring section after a predetermined time elapsing from engine stopping as the temperature of the vehicle.

In the first aspect, the vehicle temperature measuring section is provided, where the lowest temperature Vst is corrected at the vehicle temperature measuring section. In the second aspect, the lead battery temperature measuring section is provided instead of the vehicle temperature measuring section in the first aspect, so that the engine starting voltage correcting section calculates the engine starting voltage Vst1 while regarding the temperature of the lead battery measured at the lead battery temperature measuring section after a predetermined time elapsing from engine stopping as the temperature of the vehicle. In this aspect, operation and effect similar to those in the first aspect can be obtained, and since it is unnecessary to measure a temperature of the vehicle (part) such as, for example, a starter directly, which is different from the first embodiment, a task for attaching the battery state determining section can be reduced largely and a length of a lead wire from a position for measuring vehicle temperature to the battery state determining apparatus can be reduced so that influence of noise or the like can be reduced.

In the first and second aspects, when the temperature of the vehicle is represented as T, a reference temperature of temperature correction is represented as T0, a temperature correction coefficient for correcting the electric resistance at the engine starting time to a value at the reference temperature T0 is represented as alpha, and a constant taking a value in a range of from 0.9 to 1 is represented as A, the engine starting voltage correcting section can calculate the minimum voltage Vst1 according to the following Equation (1).

$$Vst1 = OCV \times Vst/[Vst + \{A + (T-T0) \times \text{alpha}\} \times (OCV - Vst)] \tag{1}$$

At this time, it is preferable that the temperature correction coefficient alpha is a temperature correction coefficient of an electric resistance of a copper wire.

In the above first and second aspects, when an internal resistance at an open-circuit voltage OCV=OCV0 (12.4<=OCV0<=13.0V) of a new lead battery is represented as r0, an internal resistance threshold value of a lead battery for lead battery replacement is represented as r_th, electric resistance of the vehicle is represented as R, and a constant taking a value in a range of from 0.9 to 1.1 is represented as B, the determination voltage operating section can calculate a boundary value Vst_th between the third region and the fourth region from the following Equation (2).

$$Vst\_th = OCV/\{B + (r0/R) \times (r\_th/r0)\} \tag{2}$$

In this case, when (r_th/r0) in Equation (2) is calculated as a constant in a range of from 1.2 to 1.6, it is unnecessary to measure the internal resistance threshold value r_th and the internal resistance r0, and since it is unnecessary to provide a current sensor in the battery state determining apparatus, cost reduction of the battery state determining apparatus can be achieved. Here, when the engine starting voltage Vst when the open-circuit voltage OCV in the lead battery within a predetermined time elapsing after use start takes OCV0 is Vst0, even if the electric resistance R of the vehicle is unknown, it is made possible to calculate the boundary value Vst_th between the third and fourth regions by calculating (r0/R) in Equation (2) according to the following Equation (3). Further, it is preferable that the lowest voltage initial value Vst0 in Equation (3) is calculated according to the following Equation (4).

$$(r0/R) = (OCV0 - Vst0)/Vst0 \tag{3}$$

$$Vst0 = Vst1 \times OCV0/OCV \tag{4}$$

In the first aspect, a lead battery temperature measuring section which measures a temperature of the lead battery is provided, so that the engine starting voltage correcting section adds a correction amount corresponding to the temperature of the lead battery measured by the lead battery temperature measuring section on one-to-one relationship to the engine starting voltage Vst1 to further correct the lowest voltage Vst1, or in the second aspect, the lowest voltage correcting section adds a correction amount corresponding to the temperature of the lead battery measured by the lead battery temperature measuring unit on one-to-one relationship to the minimum voltage Vst1 to further correct the lowest voltage Vst1, so that influence of the temperature of the lead battery can be eliminated, which results in determination about the battery state of the lead battery with a high degree of accuracy.

In the first and second aspects, the open-circuit voltage measuring section measures a stable open-circuit voltage OCV when a dark current is flowing from the lead battery, and the engine starting voltage correcting section and the determination voltage operating section calculate the lowest voltage Vst1 and the boundary value Vst_th between the third and fourth regions using an corrected open-circuit voltage OCV1 obtained by adding a correction amount which is a function of a temperature to the open-circuit voltage OCV measured at the open-circuit voltage measuring section, so that the open-circuit voltage OCV is corrected regarding the temperature, which results in determination about the battery state of the lead battery with a further high degree of accuracy.

In the present invention, instead of calculating the lead battery determination voltage Vst_th in each case, the battery state of the lead battery can be determined by defining a relationship between OCV and Vst1 of the lead battery, storing a characteristic map divided into a plurality of regions in the storage section in advance, and making determination about one of the plurality of regions of the characteristic map to which the OCV and Vst1 should belong. An example of the characteristic map is shown in FIG. 2. The characteristic map shown in FIG. 2 is divided to five regions of a first region where both OCV and Vst1 are high, a second region which is positioned on the left side of the first region, where OCV is low, a third region which is positioned on a lower side of the first region, where OCV is high and Vst1 is low, a fourth region which is positioned between the first region and the third region, and a fifth region which is positioned between the second region and the third region, and a boundary between the first and fourth regions, a boundary between the second and fifth regions, a boundary between the fourth and third regions, and a boundary between the fifth and third regions are Vst_th calculated from the open-circuit voltage OCV at the determination voltage operating section, these boundaries being curves having a positive slope like a logarithmic curve.

A boundary between the first and second boundary and a boundary between the fourth and fifth regions on the characteristic map may be straight lines. As such a straight line, for example, a straight line where SOC in a fresh state of a lead battery is a predetermined percentage can be used. The battery state determining section is provided with a degraded state determining section, and the degraded state determining unit may be configured such that, when it is determined that OCV measured at the open-circuit voltage measuring section and Vst1 measured at the lowest voltage measuring section and corrected at the lowest voltage correcting section 1 belong to the fourth to fifth regions, it is determined that the lead battery has been degraded, and when it is determined that the OCV and the Vst1 belong to the third region, it is determined that it is necessary to replace the lead battery by a new product. Further, in order to exclude inaccuracy of voltage measurement due to charging/discharging polarization generated by the lead battery, it is desirable that the open-circuit voltage measuring section measures OCV of the lead battery after a predetermined time elapsing after engine stopping.

Voltage measurement of the lead battery at an engine starting time is generally performed at a high speed of 100 Hz or higher, but voltage measurement at such a high speed may cause erroneous measurement further easily. In the present invention, analog voltage at the engine starting time of the lead battery is converted to a digital voltage value at the converting section at a speed of 100 Hz or higher, the lowest voltage value at the engine starting time of the lead battery is extracted from digital voltage values converted at the converting section by the engine starting voltage measuring section as an engine starting voltage (Vst), the lowest voltage value equal to or higher than a predetermined upper limit voltage value and an engine starting voltage equal to or lower than a predetermined lower limit voltage value are deleted from a plurality of engine starting voltages (Vst) extracted at the engine starting voltage measuring section for respective engine starts, and whether or not either one of a medium value, the most frequent value, and an average value of the remaining engine starting voltages is at most a predetermined determination reference voltage value is determined by the engine state determining section so that the degraded state of the lead battery can be determined. OCV measured the most recently is fitted in the determination map, and the determination reference voltage value can be acquired from boundary values of respective regions regarding the OCV. The lowest voltage value equal to or higher than the upper limit voltage value and the engine starting voltage equal to lower than the lower limit voltage value, which may be due to erroneous measurement, are deleted from the plurality of engine starting voltages extracted at the engine starting voltage measuring section and whether or not one of the medium value, the most frequent value, and an average value of the remaining engine starting voltages is at most the predetermined determination reference voltage value is determined by the battery state determining section, so that the degraded state of the lead battery can be determined accurately.

In the present invention, for example, the upper limit voltage value may be set to 10.5V and the lower limit voltage value may be set to 3.0V, or the upper limit voltage value may be set to the maximum value of the engine starting voltages (Vst) and the lower limit voltage value may be set to the minimum value of the lowest voltage values (Vst). A nonvolatile storage section which stores engine starting voltages (Vst) extracted at the engine starting voltage measuring section therein is further provided, so that the battery state determining section can read a plurality of the engine starting voltages (Vst) stored in the storage section. Further, an engine starting interval determining section which determines whether or not engine starting has been performed after at least a predetermined time elapsing after engine stopping is further provided in order to exclude inaccuracy of voltage measurement due to charging/discharging polarization caused by the lead battery, so that when the engine starting interval determining section make affirmative determination, the engine starting voltage measuring section can extract the lowest voltage value at the engine starting time of the lead battery from the digital voltage values converted at the converting section as an engine starting voltage (Vst).

According to the present invention, since the engine starting voltage Vst1 is calculated at the engine starting voltage correcting section by correcting the engine starting voltage Vst considering influence of the temperature of the vehicle, and whether or not the engine starting voltage Vst1 is at least the battery determination voltage Vst_th is determined at the battery state determining section, influence of the temperature of the vehicle is excluded in determination of the battery state so that such an effect can be obtained that the battery state of the battery can be determined accurately.

DETAILED DESCRIPTION OF THE PREFERRED EMBODIMENTS

A best mode of an embodiment of a battery state determining apparatus according to the present invention will be explained below with reference to the drawings.

(Configuration)

As shown in FIG. 1, a battery state determining apparatus 12 according to the embodiment is provided with a temperature sensor 2 such as a thermistor for measuring a temperature of a lead battery 1, a voltage sensor 3 which includes a differential amplifying circuit for measuring a voltage between both ends of the lead battery 1, and a microcomputer (hereinafter, called "MC") 10 for determining a battery state of the lead battery 1.

The lead battery 1 includes an approximately box-shaped battery case serving as a battery container, and a total of 6 sets of electrode plate groups are accommodated in the battery case. As material for the battery case, polymer resin such as, for example, acrylonitrile butadiene styrene (ABS), polypropylene (PP), or polyethylene (PE), which is excellent in formability, electric insulating property, corrosion resistance, durability, or the like can be selected. Each electrode plate group is configured by stacking a plurality of negative electrodes and positive electrodes via separators, where a cell voltage is set to 2.0V. Accordingly, a nominal voltage of the lead battery 1 is 12V. An upper portion of the battery case is bonded or melt-adhered to an upper lid made from polymer resin such as ABS, PP, or PE, for closing an upper portion opening portion of the battery case. The upper lid is provided with a positive electrode external output terminal and a negative electrode external output terminal of the lead battery for supplying power to the outside as a power source in a standing manner.

The positive electrode external output terminal of the lead battery 1 is connected to a central terminal of an ignition switch (hereinafter, called "IGN switch") 5. Besides the central terminal, the IGN switch 5 includes an OFF terminal, an ON/ACC terminal and a START terminal, and the central terminal can be connected to each of the OFF terminal, the ACC terminal and the START terminal in a rotary manner.

The START terminal is connected to a cell motor for engine start (starter) 9. The cell motor 9 can transmit rotational driving force to a rotational shaft of an engine 8 via a clutch mechanism (not shown).

The ON/ACC terminal is connected to auxiliaries such as an air conditioner, a radio receiver set, and lamps, and a one end of an electric generator 7 which generates electricity (power) by rotation of the engine 8 via a regulator which allows current flow in one direction and smoothes voltage. That is, one end side (anode side) of the regulator is connected to one end of the electric generator 7 and the other end side thereof is connected to the ON/ACC terminal. The rotational shaft of the engine 8 can be transmitted with power of the electric generator 7 via a clutch mechanism (not shown). Therefore, when the engine 8 is in a rotating state, the electric generator 7 is activated through the clutch mechanism (not shown) so that power from the electric generator 7 is supplied (charged) to the auxiliaries 6 and/or the lead battery 1. Incidentally, an OFF terminal is not connected to any part. The other ends of the electric generator 7, the cell motor 9, and the auxiliaries, the negative electrode output terminal of the lead battery 1, and the MC are connected to the ground, respectively.

External output terminals of the lead battery 1 are connected to the voltage sensor 3, and an output side of the voltage sensor 3 is connected to an A/D converter incorporated in the MC 10 for converting an analog voltage inputted from the voltage sensor 3 to a digital voltage. Therefore, the MC 10 can take in the voltage of the lead battery 1 as a digital value. Incidentally, the MC 10 can communicate with an upper vehicle control system 11 via an I/O.

The MC 10 is configured to include a CPU functioning as a central arithmetic processing device, a ROM wherein a basic control program of the battery state determining apparatus 12 and numerical expressions, and program data such as a characteristic map are stored, a RAM serving as a work area for the CPU and storing data temporarily, and the like. An external bus of the MC 10 is connected with a nonvolatile memory such as EEPROM (not shown). The other ends of the electric generator 7, the cell motor 9, and the auxiliaries, the negative electrode output terminal of the lead battery 1, and the MC are connected to the ground, respectively. Incidentally, the MC 10 in the embodiment samples voltage and temperature at intervals of 1 m second to store the sampled results in the RAM.

Here, the characteristic map which has been calculated according to a numerical expression stored in the ROM or which has been organized as coordinate data in advance and stored in the ROM will be explained.

In a vehicle, generally, power is supplied from a lead battery to a cell motor and the cell motor is rotated so that an engine is started. A large amount of current flows at the moment of engine starting, and the voltage of the lead battery drops largely correspondingly (see FIG. 3). In the embodiment, the lowest voltage (Vst) of the lead battery at the engine starting time is used as an index of the characteristic of the lead battery. Vst shows an output of the lead battery, but, from another standpoint, it strongly correlates with a magnitude of an internal resistance of the lead battery and it is appropriate to as an index representing SOH of the lead battery. Vst changes according to SOC of the lead battery and when SOC is high, Vst becomes high. Vst also changes according to SOH of the lead battery, and when SOH is high, Vst also becomes high.

FIG. 2 shows a relationship between SOC and Vst in a lead battery with SOH of 100% (new battery) and in respective batteries with reduced SOH (degraded batteries). As an index of SOC, an open-circuit voltage (OCV) which is a battery voltage in non-loaded state is used. FIG. 2 is hereinafter called "characteristic map", and a relationship between OCV and Vst of the lead battery is called "battery characteristic". The battery characteristic is represented by a characteristic curve.

As shown in FIG. 2, when OCV is taken for a horizontal axis and Vst is taken for a vertical axis, it is understood that battery characteristics (characteristic curves) of degraded batteries are positioned below a battery characteristic of a new battery. When a lead battery is caused to degrade to measure battery characteristics at respective SOH items, the battery characteristic (characteristic curve) is moved to further lower side as degradation advances so that SOH lowers. Thereby, degraded states of the lead battery can be sectioned by measuring both OCV and Vst of the lead battery to examine coordinates thereof on the characteristic map. Specifically, as described in detail below, respective regions of a first region where both OCV and Vst are high, a second region positioned on the left side of the first region, where OCV is low, a third region which is positioned on the lower side of the first region, where OCV is high and Vst is low are set. In addition, a fourth region showing intermediate characteristic between the first region and the third region and a fifth region showing intermediate characteristic between the second region and the third region are set.

In the first region, both OCV and Vst are high, where the lead battery in this region has a sufficient remaining capacity. When such a sound lead battery discharges so that SOC lowers, Vst remains at high levels to enter the second region. In the second region, only SOC lowers and the lead battery is returned back to the first region by only charging the lead battery so that battery replacement is not required. When many of lead batteries belonging to the third region where SOH lowers due to degradation so that the remaining capacity is reduced are charged to a full charged state, their OCVs are hardly different from a new lead battery. However, even if such a degraded lead battery does not vary regarding its OCV, it is low in Vst, and Vst_thereof sharply drops even if slight lowering of SOC occurs, which results in lowering of engine starting ability. A boundary line sectioning battery states can be represented using numerical figure showing battery characteristics of the new battery and the degraded batteries shown in FIG. 2. That is, a boundary between the first and fourth region, a boundary between the second and fifth regions, and a boundary between the fourth and third regions are lines having a positive slope when OCV is taken as the horizontal axis and Vst is taken as the vertical axis. In order to obtain a line having such a figure, it is possible to calculate a load required for a vehicle whose battery state determination should be conducted to calculate a relationship between OCV and Vst, but it is possible to measure battery characteristic of a lead battery whose SOH has lowered by an amount required as a boundary to conduct setting.

Battery characteristic (figure of a characteristic curve) shown in FIG. 2 in a new state of a lead battery is constant. However, the characteristic curve is shifted in a Y-axis direction in FIG. 2 according to a difference of magnitude of a vehicle load at an engine starting time. Even if a battery is in the same OCV (charged state), when an engine load is large, Vst of the battery lowers, so that the characteristic curves moves to a minus direction on the Y axis. In this case, since respective regions of the first to fifth regions equally move in the minus direction on the Y axis, a mutual positional relationship among the respective regions does not change. Therefore, a battery characteristic (a characteristic curve) of a new product regarding one lead battery is obtained in advance so that it is possible to respond to various vehicles by correcting a difference of a load of a vehicle.

In the embodiment, in order to prepare the characteristic map shown in FIG. 2, as the lead battery, one with JIS Standards 55B24 size was used and as an internal combustion engine to be applied, an automobile of 2000 cc-gas engine equipped with an electron control fuel injector was selected. Lead batteries having SOH of 50% and 30% at a five hours capacity respectively were prepared by accelerating and degrading lead batteries according to a light load life test of JISD 5301. Internal resistance growth rates of the lead batteries to a new product were 1.3 and 1.4. Next, OCV was measured in full charged states of the lead batteries with SOH of 50% and with SOH of 30% and the lead batteries are mounted on automobiles. Subsequently, Vst at an engine starting time was measured regarding each lead battery. While a terminal voltage of the lead battery was being measured and recorded using a general digital recorder at a sampling rate of 1.0 ms, a starting key of the engine was operated to start the engine. Vst was read from a time/terminal voltage curve obtained. Thereafter, discharging was performed at a five-hour rate current by a predetermined electric amount so that SOC was lowered. Then, OCV and Vst were measured in the same manner as the full charge state. By repeating this operation, a battery characteristic (characteristic curve) at each lead battery was obtained.

In the embodiment, the battery characteristic of a lead battery where the internal resistance growth rate to a new product was 1.3 and SOH was 50% was used for the boundary between the first and second regions and the boundary between the fourth and fifth regions, while the battery characteristic of a lead battery where the internal resistance growth rate to a new product was 1.4 and SOH was 30% was used for the boundary between the third region and the fourth and fifth regions. Further, a characteristic map was prepared by using a straight line of SOC of 50% in a new product state in the boundary between the first region and the second region and the boundary between the fourth region and the fifth region. When the internal resistance growth rate is known, it is possible to theoretically conduct mathematization of a line of the boundary between the first and fourth regions and a line of the boundary between the third and fourth regions to handle them, where the line of the boundary between the third and fourth regions is handled with a mathematical expression.

Next, evaluation of the prepared characteristic map was performed. That is, a lead battery 12 of a new product was mounted on an automobile and use thereof was started. The lead battery was used for a long period in an ordinary home use manner. Voltage measurement was performed to obtain OCV and Vst in a state that the lead battery with advanced degradation after use period lapsing was mounted on a vehicle according to the same procedure as stated above. A battery state was determined by fitting the obtained OCV and Vst into the characteristic map. After the battery state was determined, the remaining capacity of the lead battery was measured according to the five-hour rate discharge test to calculate SOC and SOH. Validity of the determination was evaluated based upon the determination result of the battery state and correspondence between SOC and SOH. The evaluation result about the validity is shown in the following Table 1. It is understood that a degraded state of the lead battery 1 can be determined correctly by measuring OCV and Vst according to the characteristic map.

TABLE 1

| Sample No. | Determination Result | Actual Measurement SOH(%) | True or False of Determination |
|---|---|---|---|
| 1 | FIRST REGION | 80 | True |
| 2 | FIRST REGION | 75 | True |
| 3 | SECOND REGION | 85 | True |
| 4 | SECOND REGION | 60 | True |
| 5 | THIRD REGION | 22 | True |
| 6 | THIRD REGION | 28 | True |
| 7 | FOURTH REGION | 45 | True |
| 8 | FOURTH REGION | 37 | True |
| 9 | FIFTH REGION | 46 | True |
| 10 | FIFTH REGION | 43 | True |

(Operation)

Next, an operation of the battery state determining apparatus 12 according to the embodiment will be explained according to control of the CPU of the MC 10 mainly with reference to a flowchart. When the MC 10 is powered ON, the CPU executes a battery state determining routine for determining a battery state of the lead battery 1. Incidentally, a program and the abovementioned characteristic map stored in the ROM is developed in the RAM according to an initial setting processing (not shown) after the MC 10 is powered ON.

As shown in FIG. 4, in the battery state determining routine, at step 102, since discharge polarization is accumulated during discharging of the lead battery 1 (during driving of a vehicle) so that a state that polarization has been solved is not reached, the lead battery 1 is held until the voltage of the lead battery 1 is stabilized. That is, it is determined that the voltage of the lead battery 1 has been stabilized by determining whether or not a predetermined period of time has elapsed after engine stop. Regarding determination about whether or not the engine 8 has stopped, for example, notification about the determination may be received from the vehicle control system 11 or the voltage of the lead battery 1 measured by the voltage sensor 3 is monitored and engine stopping may be determined on the side of the MC 10.

At the next step 104, an open-circuit voltage OCV of the lead battery 1 is measured. That is, the voltage of the lead battery 1 outputted from the voltage sensor 3 is taken in through the A/D converter as a digital value. Incidentally, OCV measurement of the lead battery 1 at step 104 can be performed for each predetermined time, and after the OCV is measured once, the measurement can be performed after the next predetermined time elapsing (the step is omitted in FIG. 4).

Next, at step 106, the temperature of the lead battery 1 outputted from the temperature sensor 22 is taken in via the A/D converter as a digital value, and an open-circuit voltage OCV1 after corrected obtained by adding an correction amount which is a correction function of a temperature to the measured open-circuit voltage OCV is calculated according to a temperature correction map, as shown in FIG. 5. Since dark current is flowing in the lead battery 1 during engine stopping, the voltage of the lead battery 1 lowers to a value lower than the actual open-circuit voltage OCV, and a difference from the actual open-circuit voltage OCV becomes large according to the lowering of the temperature. Therefore, at the step 106, a more accurate open-circuit voltage OCV after corrected is calculated by adding the temperature correction amount shown in FIG. 5 to the open-circuit voltage OCV of the lead battery 1. It is desirable that such a temperature correction map is changed according to battery design, battery degradation, or dark current of a vehicle. When the dark current cannot be known, as shown in FIG. 5, excellent results in many vehicles can be obtained by utilizing a correction map corresponding to dark current of 10 to 20 mA supposed.

Next, at step 108, determination is made about whether or not the current starting is the first engine starting after the voltage of the lead battery 1 has been stabilized. A processing at the step 108 can be classified to a step regarding whether or not the engine has been started and a step regarding whether or not when the engine has been started, the starting is the first starting after voltage stabilization. The determination about whether or not the engine has been started can be made based upon whether or not characteristic voltage drop has been detected in engine starting where, for example, voltage drop of 1V or more occurs for several milliseconds such as shown in FIG. 3. A sampling rate of the A/D converter incorporated in the MC 10 is 1 msec and a timing of engine starting can be detected accurately but when an A/D converter with a sampling rate of less than 100 Hz is used, a timing of measuring the lowest voltage value Vst is delayed so that an accurate lowest voltage value Vst cannot be measured. By determining whether or not a notification indicating that the central terminal of the IGN switch 5 has been connected to the START terminal has been received, whether or not the engine has been started can be determined. In this case, the notification indicating that the central terminal has been connected to the START terminal can be received directly from the IGN switch 5 or via the vehicle control system 11. When the determination is negative, the control returns back to the step 102.

On the other hand, when the determination at the step 108 is affirmative, the lowest voltage (Vst) of the lead battery 1 at an engine starting time is measured at step 110. That is, by taking voltage data of the leading battery 1 at the engine starting time at the sampling rate of 1 msec of the A/D converter incorporated in the MC 10 (storing the voltage data in the RAM) and extracting the minimum value of the taken-in voltage data, the lowest voltage Vst of the leading battery 1 at the engine starting time is measured (also see FIG. 3) to be recorded in an EEPROM. In the embodiment, the sampling rate is 100 Hz, but using one having the sampling rate of less than 100 Hz results in low resolution so that the lowest voltage value Vst cannot be taken with high accuracy.

At the next step 112, the engine starting voltage Vst1 with corrected engine starting voltage Vst is calculated based upon the open-circuit voltage OCV temperature-corrected at the step 106 and the temperature of the vehicle. Here, the meaning of calculation and an arithmetic expression of the engine starting voltage Vst1 will be explained in detail.

The voltage at the engine starting time shown in FIG. 3 depends on electric resistance and mechanical resistance of the vehicle, and both the resistances are influenced by temperature. It is difficult to predict temperature dependency of the mechanical resistance but it is possible to predict the electric resistance by assuming material quality of conductor. It is made possible to exclude influence of the mechanical resistance by utilizing an engine starting voltage Vst (the lowest voltage Vst measured at the step 110) when the voltage has first lowered largely, which is thought to be a state where the piston hardly starts to move. Further, influence of the electric resistance to the voltage can also be excluded by correcting the lowest voltage Vst to a value at the reference temperature (for example, 25° C. of the room temperature) according to the following Equation (1).

$$Vst1 = OCV \times Vst/[Vst + \{A + (T-T0) \times \text{alpha}\} \times (OCV - Vst)] \quad (1)$$

In the Equation (1), OCV is the open-circuit voltage (OCV1) temperature-corrected at the step 106, T is the temperature of the vehicle (for example, the cell motor 9), T0 is the abovementioned reference temperature, A is a constant taking a value in a range of 0.9 to 1.1 (A is set to 1.0 in this example), and alpha is a temperature correction coefficient for correcting the electric resistance of the vehicle at the engine starting time to a value at the reference temperature T0. Excellent correction can be expected, for example, by utilizing a value of soft copper wire (JIS C3102) as the temperature correction coefficient alpha.

As shown in FIG. 1, regarding the temperature T of the vehicle, it is originally desirable that the temperature of the cell motor 9 is measured by the temperature sensor 4, but since the temperature of the cell motor 9 and the temperature of a vehicle part around the same become approximately equal to each other after a sufficient time elapses from engine stopping, whether or not a sufficiently long time has elapsed after the previous engine stopping is determined (whether or not 6 hours have been elapsed is determined at the step 102), the temperature of the lead battery 1 is measured during engine stopping or just after engine starting (see the step 106), and it is utilized as the temperature T of the vehicle in the embodiment.

Next, at step 114, the lowest voltage Vst1 is further corrected to be stored in the EEPROM considering the temperature dependency of the battery characteristic. As shown in FIG. 6, the correction is performed by adding the temperature correction amount to the lowest voltage Vst1 according to the temperature correction map. The temperature correction map shown in FIG. 6 fluctuates according to a lead battery to be used. Since the discharge voltage is a function of a current and the temperature characteristic is difficult to a certain degree, accuracy can be further improved in case of a battery state determining apparatus which can acquire current information (provided with a current sensor) by defining the temperature correction amount for each current. Since the temperature correction coefficient does not actually change so much with an inrush current of 500 to 900 A at an engine starting time in an ordinary automobile, a battery state determining apparatus which can be put in a practical use can be realized, especially, even if a current sensor is not provided thereto.

At step 116, a plurality of engine starting voltages Vs1 written in the EEPROM for respective engine starts is read. Next, at step 118, by removing an engine starting voltage Vst1 equal to or more than a preset upper limit voltage value (for example, 10.5V) and an engine starting voltage Vst1 equal to or less than a preset lower limit voltage value (for example, 3.0V) from the read engine starting voltages Vst1, data which is regarded as error measurement data is excluded and an average value of the remaining engine starting voltages Vst1 is calculated.

At the next step 120, whether or not the number of times of engine starting is less than five times and the open-circuit voltage OCV exceeds 12.5V is determined. In other words, whether or not the lead battery 1 is not degraded (new product) and it is put in a fully charged state is determined. When the determination is affirmative, the lowest voltage Vst0 in a state that the lead battery 1 is not degraded and it is in a fully charged state is calculated according to the following Equation (4) to be stored in the EEPROM at step 122. In other words, the lowest voltage Vst0 is a voltage at the engine starting time with an open-circuit voltage OCV0 ($12.4V \leq OCV0 \leq 13.0V$) in a state that the lead battery 1 is not degraded (new product) and is in a fully charged state.

$$Vst0 = Vst1 \times OCV0/OCV \qquad (4)$$

At step 122, the engine starting voltages Vst0 which have been already stored in the EEPROM are read to calculate an average value of the engine starting voltages Vst0 to store the same in the EEPROM. Therefore, an average value of the plurality of engine starting voltages Vst0 in a state that the lead battery 1 is not degraded and is put in a fully charged state is finally calculated and stored in the EEPROM.

Next, at step 124, in the open-circuit voltage OCV0 of the lead battery 1 in a non-degraded and fully charged state, when an internal resistance is represented as r0 and the electric resistance of the vehicle is represented as R, (r0/r) is calculated according to the following Equation (3) and stored in the EEPROM. At the step 124, (r0/R)s which have been already stored in the EEPROM are read and an average value of (r0/R)s is calculated to be stored in the EEPROM. Therefore, an average value of (r0/R)s in a non-degraded and fully charged state of the lead battery 1 plural times is finally calculated and stored in the EEPROM.

$$(r0/R) = (OCV0 - Vst0)/Vst0 \qquad (3)$$

Further, at step 126, a boundary value Vst_th between the third and fourth regions, representing a voltage at the engine starting time of the lead battery 1 when the growth rate of the internal resistance of the lead battery 1 reaches a predetermined value for battery replacement from the open-circuit voltage temperature-corrected at the step 106 is calculated according to the following Equation (2) and stored as coordinates of the characteristic map. The average value of (r0/R)s is read from the EEPROM to be assigned to the Equation (2). When a combination of the lead battery 1 and the model of the vehicle on which the lead battery 1 is mounted has been determined in advance, a value of (r0/R) may be measured in advance to be assigned in the Equation (2) as a constant, where the steps 120 to 124 are not required. Incidentally, in the Equation (2), OCV represents the open-circuit voltage temperature-corrected at the step 106 (OCV1), r_th represents an internal resistance threshold value of a battery for battery replacement, B represents a constant taking a value in a range of 0.9 to 1.1 (set to 1.0 in this example), (r_th/r0) represents a constant taking a value in range of 1.2 to 1.6 (set to 1.4 in this example), namely, a growth rate of the internal resistance of the lead battery 1 from a new product thereof is represented.

$$Vst\_th = OCV/\{B + (r0/R) \times (r\_th/r0)\} \qquad (2)$$

Here, the relationship of the Equations (2) to (4) will be explained. In the Equation (2), an electric resistance R of a vehicle is contained. It is theoretically possible to measure electric resistances of vehicles different for respective models thereof actually to write them in a ROM or an EEPROM, but it is difficult to perform such an operation commercially. On the other hand, (r/O/R) can be calculated using the Equation (3). In the Equation (3), Vst0 is Vst (Vst1 in this example) in OCV=OCV0. In fact, since OCV at a time of acquiring Vst is convenient and it is unlikely that OCV becomes OCV0, calculation of a boundary value Vst_th between the third and fourth regions can be performed by performing correction to Vst0 at OCV0 according to the Equation (4) and assigning the Equations (4) and (3) to the Equation (2), even if there is no way to know the electric resistance R of the vehicle.

Since step 128 is prepared for determination at the step 120, the number of times of engine starting is counted and a region determination processing is performed at the next step 130. That is, determination is made about a region of the five regions on the characteristic map to which the degraded state of the lead battery 1 belongs by fitting the most recent (latest) OCV taken in at the step 104 and the step 106 and Vst1 acquired at the step 114 and averaged at the step 118 into the characteristic map shown in FIG. 2. Next, at step 132, determination is made about whether or not the degraded state of the lead battery 1 belongs to the third region on the characteristic map. When the determination is affirmative, the battery state determining routine is terminated and when the determination is affirmative, such a fact that the lead battery 1 has degraded is notified to the vehicle control system 11 at the next step 134 to terminate the battery state determining routine. Incidentally, in FIG. 4, for easy explanation, an example where the battery state determining routine is terminated in the processing at the steps 132 and 134 has been shown, but the control actually returns back to the step 102 from which determination about the battery state of the lead battery 1 is continued.

Because there is a possibility that engine restarting (ISS) after vehicle stopping becomes impossible, the vehicle control system 11 which has received the notification indicating the fact that the lead battery 1 has degraded prohibits automatic idle stopping and displays such a fact that the lead battery 1 has degraded on an instrument panel to encourage the driver to perform replacement of the lead battery 1. The driver can know that the lead battery 1 has degraded by viewing the instrument panel and can secure ISS by replacing the lead battery 1 by a lead battery having the same specification at a service station.

(Operation, Effect, and the Like)

Next, an operation, an effect, and the like of the battery state determining apparatus 12 according to the embodiment will be explained.

In the battery state determining apparatus 12 according to the embodiment, since the engine starting voltage Vst1 obtained by correcting the engine starting voltage Vst considering influence of the temperature of the vehicle is calculated according to the Equation (1) (step 112), and determination about whether or not the engine starting voltage Vst1 is in the region 3 on the characteristic map (steps 130 to 132) is made for making determination about replacement of the lead battery 1, erroneous determination caused by influence due to the temperature of the vehicle is excluded in replacement determination based upon degradation of the lead battery 1, so that the battery state of the lead battery 1 can be determined correctly. Accordingly, engine stall at an idle stop and start time can be prevented.

In the battery state determining apparatus 12 according to the embodiment, since the temperature of the lead battery 1 measured after at least the predetermined time (for example, six hours) elapsing from engine stopping is regarded as the temperature of the vehicle, and the engine starting voltage Vst1 is calculated according to the Equation (1), it is unnecessary to measure the temperature of the vehicle such as the cell motor 9, as described above, so that labor hour at a mounting time (add-on) of the battery state determining apparatus can be saved largely and a length of a lead wire from the cell motor 9 to the battery state determining apparatus 12 can be reduced, and influence due to noises or the like can be reduced.

Further, in the battery state determining apparatus 12 according to the embodiment, as shown in FIG. 5, the open-circuit voltage OCV1 after corrected obtained by adding the correction amount which is a correction function of a temperature to the measured open-circuit voltage OCV is calculated (step 106), and the engine starting voltage Vst1 (step 112) and the battery determination voltage Vst_th (step 126) are calculated according to the Equation (1) and the Equation (2) using the corrected open-circuit voltage OCV1. Therefore, the battery state determining apparatus 12 can make determination about the battery state of the lead battery 1 more accurately. In the battery state determining apparatus 12 according to the embodiment, as shown in FIG. 6, the engine starting voltage Vst1 is further corrected by adding the correction amount corresponding to the temperature of the lead battery 1 on one-to-one relationship to the engine starting voltage Vst1. Therefore, determination about the battery state of the lead battery 1 can be made further correctly.

As shown in FIG. 2, the battery state determining apparatus 12 according to the embodiment stores the characteristic map which has been divided into the five regions and defining the relationship between OCV of the lead battery 1 and Vst at the engine starting time of the lead battery 1 therein. The characteristic map has been prepared based upon actual use state at each SOH of the lead battery 1. By fitting taken-in OCV (steps 104 to 106) and measured Vst1 (steps 110 to 118) in the characteristic map, a region to which the lead battery 1 whose degradation proceeds due to engine starting belongs can be determined with accuracy and in real time (see step 130 and Table 1).

incidentally, in the embodiment, the example where the fact that replacement of the lead battery 1 is required when it is determined that the lead battery 1 belongs to the third region is notified to the vehicle control system 11 has been shown, but such a configuration can be adopted that when the lead battery 1 belongs to the fourth region or the fifth region, the fact that the lead battery 1 has degraded is notified to the vehicle control system 11. Further, the degradation level may be notified in a multi-stage manner by sub-dividing the fourth region or the fifth region in the Y-axis direction. In the embodiment, the example where notification to the vehicle control system 11 is made has been shown, but such a configuration can be adopted that the battery state determining apparatus is provided with a buzzer or a light emitting device and direct notification to a user is performed using the buzzer or the light emitting device of the battery state determining apparatus. In the embodiment, the example where a region of the five regions to which the lead battery 1 belongs is determined based upon one time measurement of each of OCV and Vst has been shown but since there is such a possibility that voltage measurement error also occurs due to noises or the like in such a case that the battery state determining apparatus 12 is accommodated, for example, in the engine room, such a configuration may be adopted that degradation determination is made based upon a plurality of determinations in order to further improve degradation determination accuracy to the lead battery 1.

In the embodiment, the example where data which is regarded as erroneous measurement data is excluded by eliminating the lowest voltage value Vst equal to or more than the upper limit voltage value (10.3V) and the lowest voltage value equal to or lower than the lower limit voltage value (3.0V) from the lowest voltage values Vst has been shown but the present invention is not limited to this example, and such a configuration can be adopted that the maximum value of a plurality of lowest voltage values Vst and the minimum value of the lowest voltage values Vst are excluded.

In the embodiment, whether or not the predetermined time has elapsed after engine stopping is determined, but regarding this determination, timing may be conducted by an internal clock in the MC 10, a timer (IC) may be provided separately, or the MC 10 can receive a stopping time of the engine, a start starting time (current time) of the engine or the like from the vehicle control system 11 to make determination. Further, in the embodiment, the example where the A/D converter having a sampling rate of 1 msec (100 Hz) as the converting section has been shown, but the present invention is not limited to this example and such a configuration can be adopted that the voltage of the lead battery 1 at the engine starting time can be sampled at a sampling rate of 100 Hz or higher.

In the battery state determining apparatus 12 according to the embodiment, the average value (step 122) in the calculation of Vst0 is calculated but a medium value or a mode value may be used, and the average value (step 124) in the calculation of (r0/R) is similarly calculated but a medium value or a mode value may be used.

In the embodiment, the example where the temperature of the lead battery 1 after the predetermined time elapsed from engine stopping is regarded as the temperature of the vehicle and the engine starting voltage Vst1 is calculated has been shown, but the present invention is not limited to this example and the temperature sensor 4 actually measuring the temperature of the cell motor 9 (vehicle) may be provided as shown in FIG. 1. Further, in the embodiment, the map for the correction amount to the temperature has been shown in FIGS. 5 and 6, and the present invention is not limited to this embodiment and a relational expression representing the relationship between the temperature and the correction amount may be used.

Further, in the embodiment, the example where the constants A and B are set to 1.0 in the equations (1) and (2) has been shown, but these constants may be changed to proper values in the range of 0.9 to 1.1. In the embodiment, the example that the interval of measurement of the temperature conducted by the temperature sensor 3 is set to 1 ms which is equal to the voltage measurement interval has been shown, but since the temperature change is not sharp, as shown in FIG. 6, such a processing that measurement is performed at intervals longer than the voltage measurement interval such as, for example, an interval of 1 second, the measurement result is stored in the RAM, and the nearest measurement temperature is used can be performed.

Further, in the embodiment, the example where the boundary value Vst_th between the third and fourth regions is calculated using the equation (2) at the step 126, but the boundary value Vst_th1 between the first and fourth regions can be calculated using a similar equation ((r_th/r0) at this time is set to, for example, 1.3). In the embodiment, the configuration using the MC 10 is shown but a configuration of a hardware circuit may be adopted entirely or partially instead of the MC 10.

EXAMPLE

Next, an example of the battery state determining apparatus which determines a batter state of 65B24 mounted on a gasoline-powered car of 2000 cc displacement will be explained according to the above embodiment. A battery state determining apparatus manufactured for comparison will be explained in addition.

Example 1

After engine starting was performed five times at intervals of 6 hours, the gasoline-powered car was positioned in a temperature-controlled room maintained at a low temperature, where the engine thereof was started under temperatures of 0° C. and −10° C. Using an incircuit emulator, one which can confirm an internal variable of the battery state determining apparatus was used. When confirming the engine starting voltage after temperature connection Vst1, values shown in the following Table 2 could be obtained. It is understood that the temperature connection is sufficiently accurate.

TABLE 2

| Item | Vst (V) after Vehicle/Battery Temperature Correction | | |
| --- | --- | --- | --- |
| | −10 deg. Cel. | 0 deg. Cel. | 25 deg. Cel. |
| Example 1 | 8.6 | 8.6 | 8.6 |
| Comparative Example 1 | 8.3 | 8.4 | 8.6 |

Comparative Example 1

In the battery state determining apparatus according to Comparative Example 1, as shown in FIG. 7, vehicle temperature correction and temperature correction of the open-circuit voltage were not performed and a test similar to the battery state determining apparatus according to Example 1 was conducted. That is, a flowchart shown in FIG. 7 does not include the processings at the steps 106 and 112 in the flowchart shown in FIG. 4. The test result is shown in Table 2. The battery state determining apparatus according to Comparative Example 1 is larger in error of temperature correction than the battery state determining apparatus according to Example 1. It is understood from this result that the battery state determining apparatus according to Example 1 is superior to the battery state determining apparatus according to Comparative Example 1 regarding the battery state determination.

INDUSTRIAL APPLICABILITY

Since the present invention provides a battery state determining apparatus which can calculate a battery state of a battery accurately from an engine starting voltage considering influence of a temperature of a vehicle, it contributes to manufacture and sale of a battery state determining apparatus, so that it has industrial applicability.

Explanation of Reference Numerals

Figure 1:
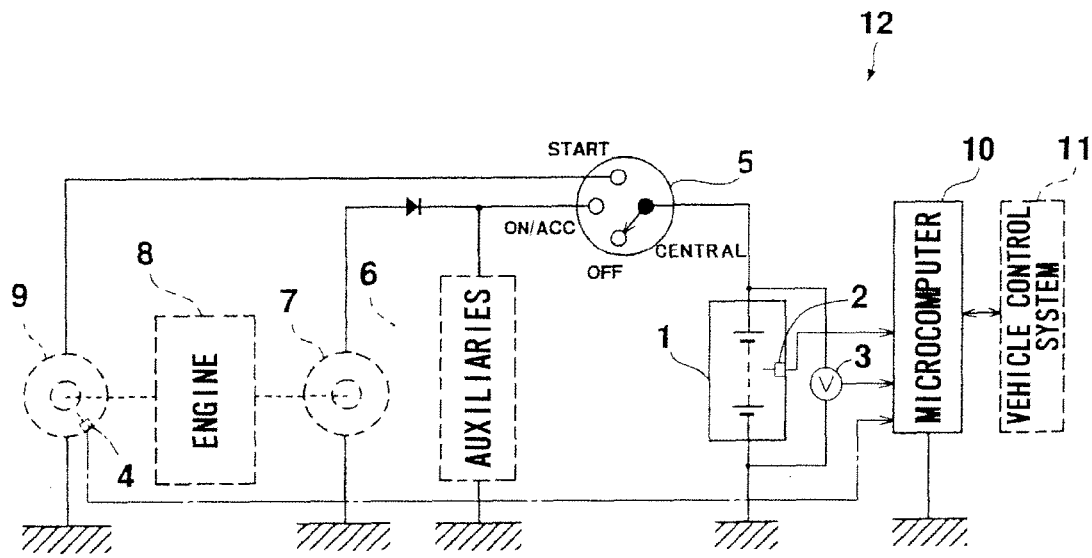
FIG. 1 is a block wiring diagram of a battery state determining apparatus and a vehicle according to an embodiment to which the present invention can be applied.
Figure 2:
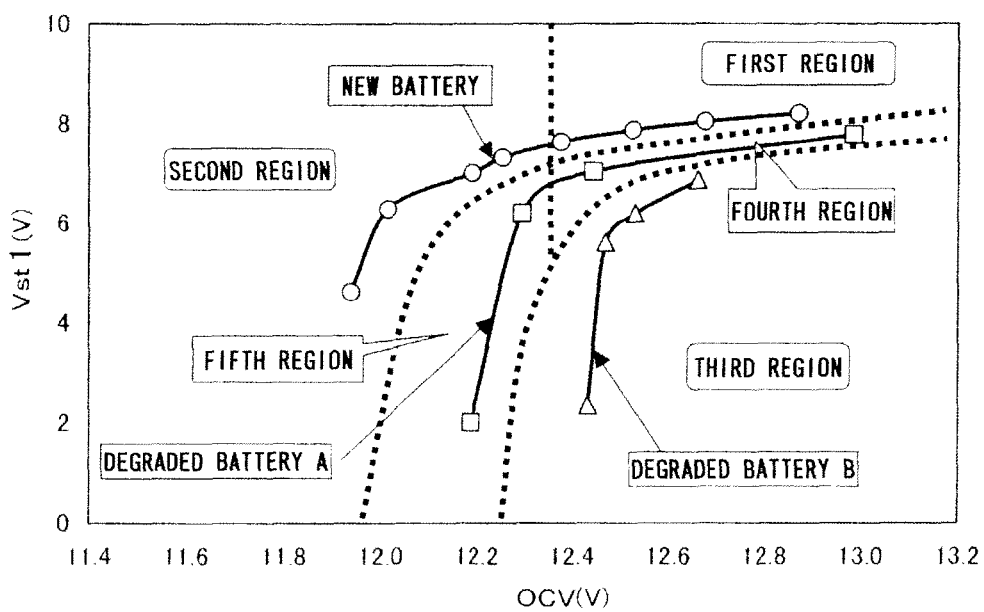
FIG. 2 is an explanatory diagram showing a concept of a characteristic map of the battery state determining apparatus according to the embodiment.
Figure 3:
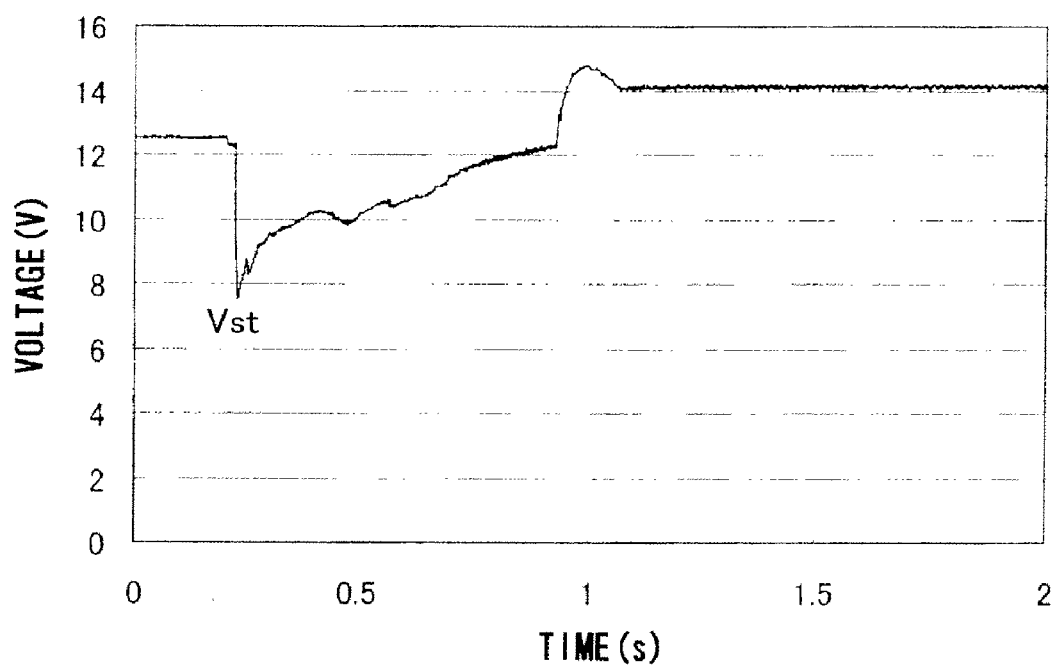
FIG. 3 is a graph showing voltage change of a lead battery at an engine starting time.
Figure 4:
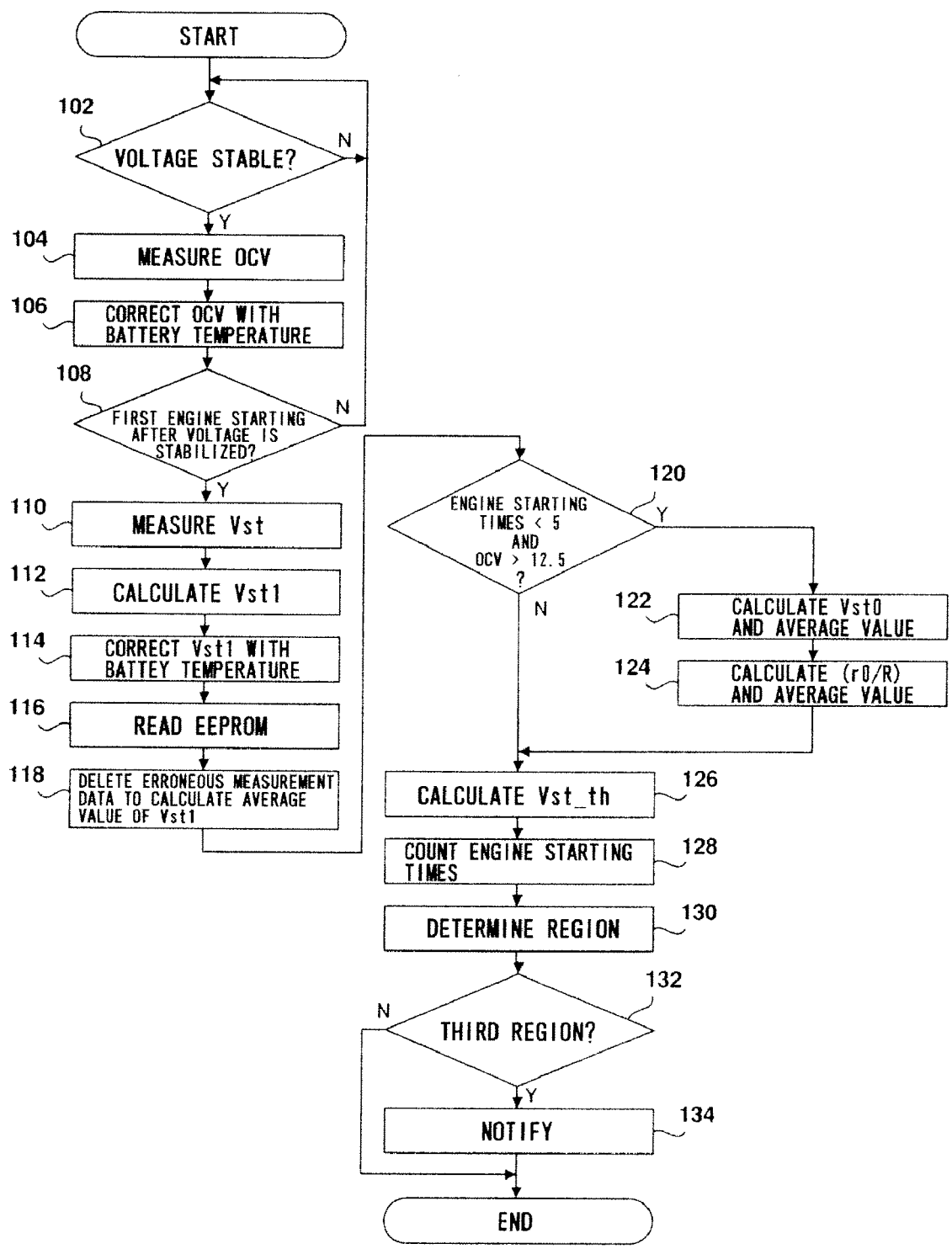
FIG. 4 is a flowchart of a battery state determining routine which a CPU in a MC of the battery state determining apparatus according to the embodiment executes.
Figure 5:
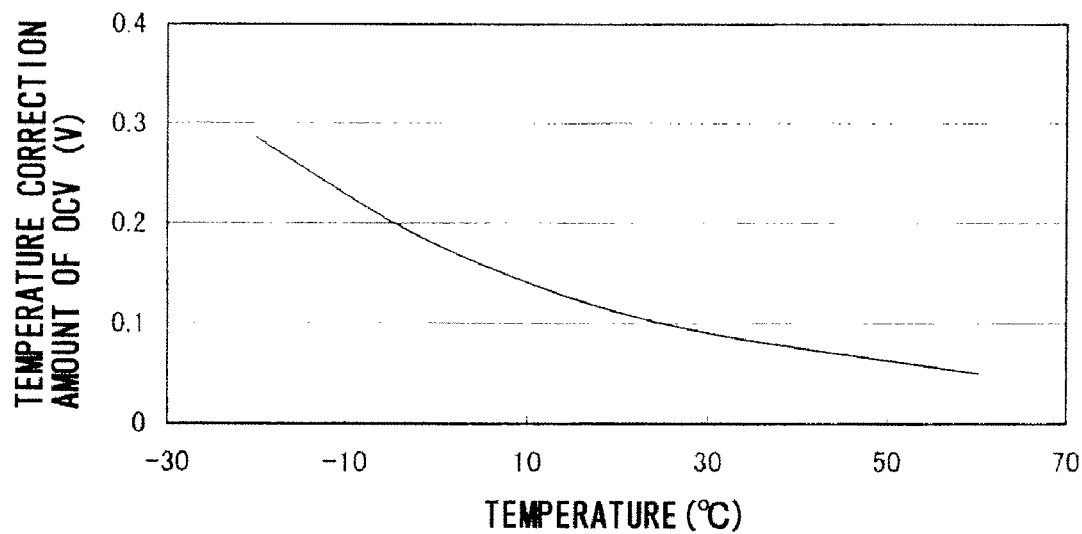
FIG. 5 is a map showing a temperature correction amount of an open-circuit voltage of a lead battery at a dark current flowing time.
Figure 6:
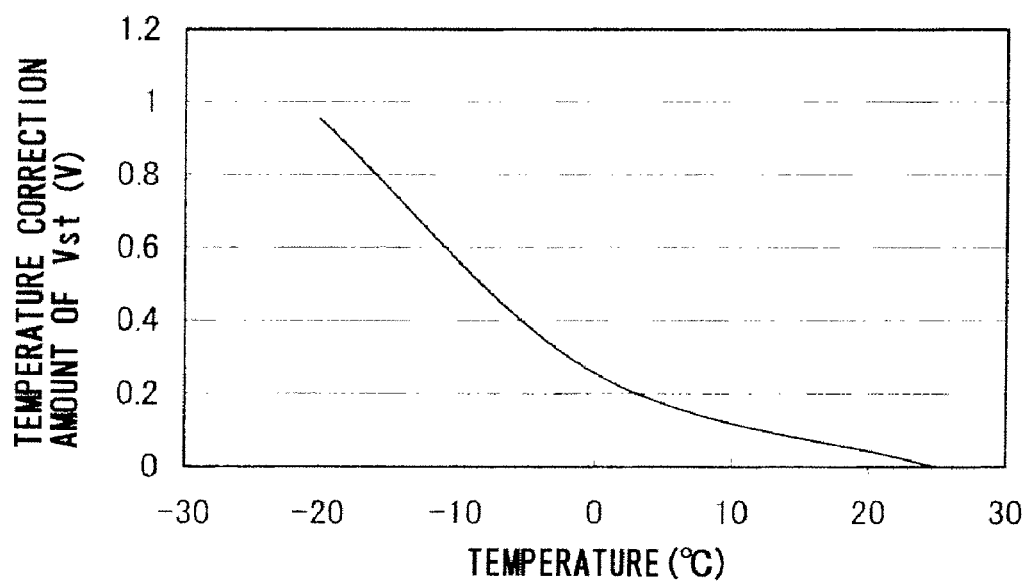
FIG. 6 is a map showing a temperature correction amount of the lowest voltage Vst1.
Figure 7:
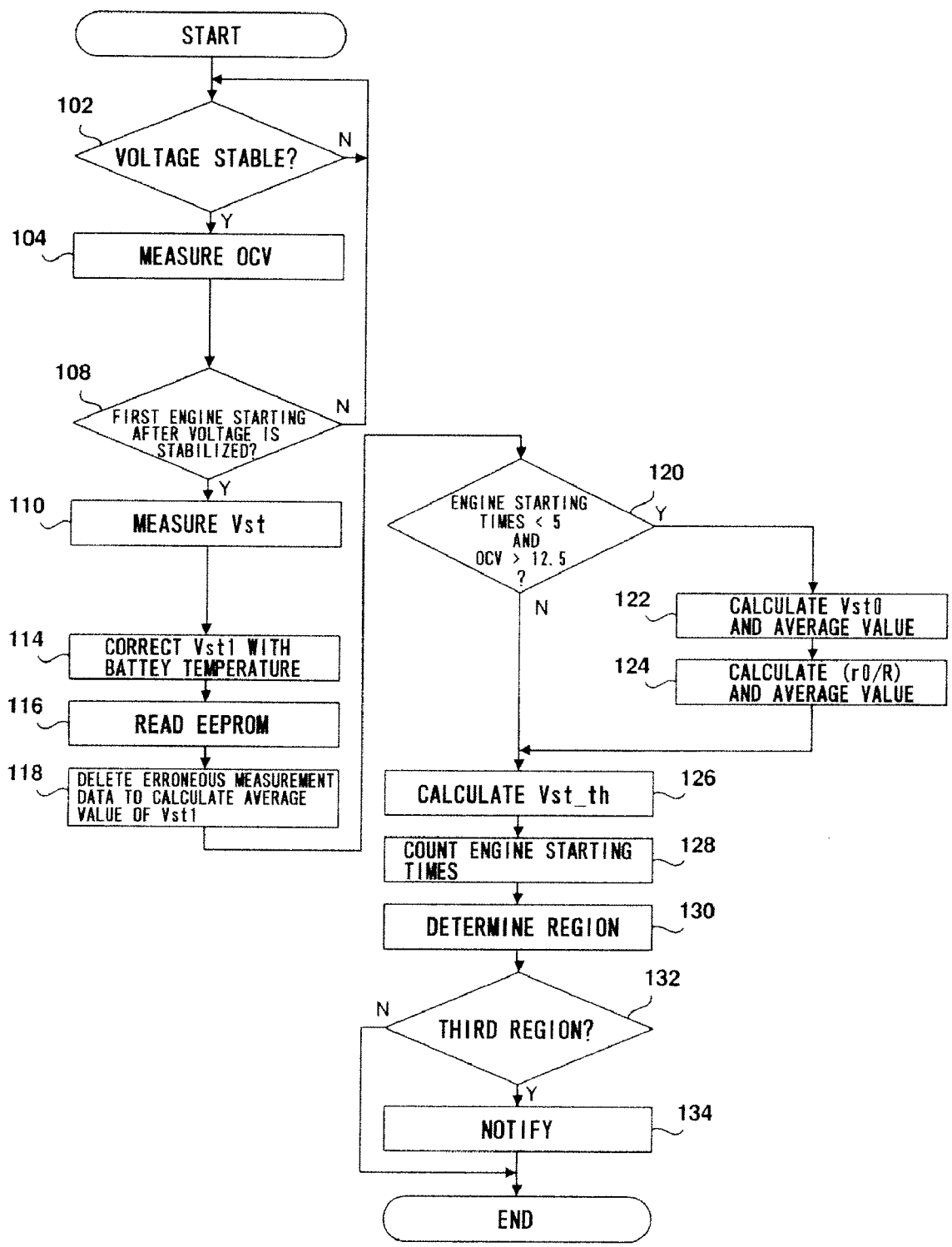
FIG. 7 is a flowchart of a battery state determining routine which a CPU in a MC of a battery state determining apparatus according to Comparative Example 1 executes.

1: lead battery
2: temperature sensor (a portion of a lead battery temperature measuring section)
3: voltage sensor (a portion of an open-circuit voltage measuring section, a portion of a lowest voltage measuring section)
4: temperature sensor (a portion of a vehicle temperature measuring section)
10: microcomputer (a portion of an open-circuit voltage measuring section, a portion of a lowest voltage measuring section, a storage section, a lowest voltage correcting section, a battery state determining section)
12: battery state determining apparatus

What is claimed is:

1. A battery state determining apparatus for determining a battery state of a lead battery mounted on a vehicle, comprising:
   an open-circuit voltage measuring section which measures an open-circuit voltage OCV of the lead battery;
   an engine starting voltage measuring section which measures an engine starting voltage Vst representing a voltage at an engine starting time of the lead battery;
   a temperature measuring section which measures a temperature of at least one of the vehicle and the lead battery;
   an engine starting voltage correcting section which calculates an engine starting voltage Vst1 obtained by correcting the engine starting voltage Vst measured at the engine starting voltage measuring section based upon the open-circuit voltage OCV measured at the open-circuit voltage measuring section and the temperature measured at the temperature measuring section;
   a determination voltage arithmetic section which calculates, from the open-circuit voltage OCV measured at the open-circuit voltage measuring section, a lead battery determination voltage Vst_th representing a voltage at an engine starting time of the lead battery when an increase rate of internal resistance of the lead battery reaches a predetermined value for lead battery replacement; and
   a battery state determining section which determines whether or not the engine starting voltage Vst1 calculated at the engine starting voltage correcting section is equal to or more than the lead battery determination voltage Vst_th calculated at the determination voltage arithmetic section,
   wherein the battery state determining section determines a degraded state of the lead battery by determining a region to which the OCV measured at the open-circuit voltage measuring section and Vst1 calculated at the engine starting voltage correcting section belong among a plurality of regions in a pre-determined characteristic map which defines a relationship between OCV and Vst1 of the lead battery and which is divided into the plurality of regions representing the degraded state of the lead battery.

2. The battery state determining apparatus according to claim 1,
   wherein the temperature measuring section measures the temperature of the lead battery, and wherein the engine starting voltage correcting section calculates the engine starting voltage Vst1 while regarding the temperature of the lead battery measured at the temperature measuring section after a predetermined time elapsed since engine stopping as the temperature of the vehicle.

3. The battery state determining apparatus according to claim 1, wherein, when the temperature of the vehicle is represented as T, a reference temperature of temperature correction is represented as T0, a temperature correction coefficient for correcting electric resistance of the vehicle at an engine starting time to a value based upon the reference temperature T0 is represented as alpha, and a constant taking a value in a range of from 0.9 to 1.1 is represented as "A", the engine starting voltage correcting section calculates the engine starting voltage Vst1 according to the following Equation (1)

$$Vst1=OCV \times Vst/[Vst+\{A+(T-T0) \times alpha\} \times (OCV-Vst)] \quad (1).$$

4. The battery state determining apparatus according to claim 3, wherein the temperature correction coefficient alpha is a temperature correction coefficient of electric resistance of a copper wire.

5. The battery state determining apparatus according to claim 1, wherein, when internal resistance of a new lead battery at the open-circuit voltage OCV=OCV0 (12.4<=OCV0<=13.0V) is represented as r0, an internal resistance threshold value of a lead battery for lead battery replacement is represented as r_th, electric resistance of the vehicle is represented as R, and a constant taking a value in a range of from 0.9 to 1.1 is represented as "B", the determination voltage arithmetic section calculates the lead battery determination voltage Vst_th according to the following Equation (2)

$$Vst\_th=OCV/\{B+(r0/R) \times (r\_th/r0)\} \quad (2).$$

6. The battery state determining apparatus according to claim 5, wherein the determination voltage arithmetic section calculates (r_th/r0) in the Equation (2) as a constant falling within a range of from 1.2 to 1.6.

7. The battery state determining apparatus according to claim 5, wherein, when the engine starting voltage Vst in a case in which the open-circuit voltage OCV of the new lead battery takes the OCV0 is represented as Vst0, the determination voltage arithmetic section calculates (r_th/r0) in the Equation (2) according to the following Equation (3)

$$(r0/R)=(OCV0-Vst0)/Vst0 \quad (3).$$

8. The battery state determining apparatus according to claim 7, wherein the determination voltage arithmetic section calculates the engine starting voltage Vst0 in the Equation (3) according to the following Equation (4)

$$Vst0=Vst1 \times OCV0/OCV \quad (4).$$

9. The battery state determining apparatus according to claim 1, wherein the temperature measuring section measures the temperatures of the vehicle and the lead battery, and wherein the engine starting voltage correcting section further corrects the engine starting voltage Vst1 by adding an correction amount corresponding to the temperature of the lead battery measured at the temperature measuring section on one-to-one relationship to the engine starting voltage Vst1 which is obtained by correcting the engine starting voltage Vst measured at the engine starting voltage measuring section based upon the temperature of the vehicle measured at the temperature measuring section.

10. The battery state determining apparatus according to claim 1, wherein the open-circuit voltage measuring section measures a stable open-circuit voltage OCV when a dark current is flowing from the lead battery, and the engine starting voltage correcting section and the determination voltage arithmetic section calculate the engine starting voltage Vst1 and the lead battery determination voltage Vst_th using an open-circuit voltage OCV1 after corrected obtained by adding a correction amount which is a function of a temperature to the open-circuit voltage OCV measured at the open-circuit voltage measuring section.

11. The battery state determining apparatus according to claim 1, further comprising a storage section which stores therein the characteristic map, wherein the battery state determining section determines the degraded state of the lead battery by determining the region among the plurality of regions in the characteristic map stored in the storage section, and wherein, when OCV is taken in a horizontal axis and Vst1 is taken in a vertical axis, the characteristic map stored in the storage section is divided to five regions of a first region where both OCV and Vst1 are high, a second region positioned on the left side of the first region where OCV is low, a third region positioned on a lower side of the first region where OCV is high and Vst1 is low, a fourth region positioned between the first and third regions, and a fifth region between the second and third regions, and wherein a boundary between the first and fourth regions, a boundary between the second and fifth regions, a boundary between the fourth and third regions, and a boundary between the fifth and third regions are Vst_th calculated from OCV at the determination voltage arithmetic section, have positive slopes, and are curves with a shape of a logarithmic curve.

12. The battery state determining apparatus according to claim 11, wherein a boundary between the first and second regions and a boundary between the fourth and fifth regions of the characteristic map stored in the storage section are straight lines.

13. The battery state determining apparatus according to claim 11, wherein the battery state determining section determines that the lead battery has degraded when determining that OCV measured at the open-circuit voltage measuring section and Vst1 calculated at the engine starting voltage correcting section belong to the fourth to fifth regions of the characteristic map, and the battery state determining section determines that replacement of the lead battery is required when determining that OCV measured at the open-circuit voltage measuring section and Vst1 calculated at the engine starting voltage correcting section belong to the third region.

14. The battery state determining apparatus according to claim 11, wherein the open-circuit voltage measuring section measures OCV of the lead battery after a predetermined time elapsing after engine stopping.

15. The battery state determining apparatus according to claim 1, further comprising a converting section which converts an analog voltage at an engine starting time of the lead battery to a digital voltage value at a rate of 100 Hz or higher, wherein the battery state determining section deletes a lowest voltage value equal to or higher than a predetermined upper limit voltage value and a lowest voltage value equal to or lower than a predetermined lower limit voltage value from a plurality of the engine starting voltages (Vst) extracted for respective engine starts at the engine starting voltage measuring section and determines whether or not one of a medium value, a mode value and an average value of the remaining lowest voltage values is at most a preset determination reference voltage value.

16. The battery state determining apparatus according to claim 15, wherein the upper limit voltage value is 10.5V and the lower limit voltage value is 3.0V.

17. The battery state determining apparatus according to claim 15, wherein the upper limit voltage value is the maximum value of the lowest voltage values (Vst) and the lower limit voltage value is the minimum value of the lowest voltage values (Vst).

18. The battery state determining apparatus according to claim 15, further comprising a nonvolatile storage section which stores the lowest voltage values (Vst) extracted at the engine starting voltage measuring section, wherein the battery state determining section reads a plurality of the engine starting voltages (Vst) stored in the storage section.

19. The battery state determining apparatus according to claim 15, further comprising an engine starting interval determining section which determines whether or not engine start has been performed after at least a predetermined time elapsing after engine stopping, wherein, when the engine starting interval determining section makes an affirmative determination, the engine starting voltage measuring section extracts an engine starting voltage value (Vst) at an engine starting time of the lead battery from digital voltage values converted at the converting section.

20. The battery state determining apparatus according to claim 1, further comprising a storage section which stores therein the characteristic map, wherein the battery state determining section determines the degraded state of the lead battery by determining the region among the plurality of regions in the characteristic map stored in the storage section, and wherein, when OCV is taken in a horizontal axis and Vst1 is taken in a vertical axis, the characteristic map stored in the storage section is divided to regions including a first region where both OCV and Vst1 are high, a second region where OCV is low, and a third region where OCV is high and Vst1 is low.

21. The battery state determining apparatus according to claim 20, wherein the characteristic map further includes a fourth region positioned between the first and third regions, and a fifth region between the second and third regions.

* * * * *